(12) United States Patent
Naru et al.

(10) Patent No.: US 9,479,186 B1
(45) Date of Patent: Oct. 25, 2016

(54) GAIN AND OFFSET CORRECTION IN AN INTERPOLATION ADC

(71) Applicant: Texas Instruments Incorporated, Dallas, TX (US)

(72) Inventors: Srinivas Kumar Reddy Naru, Bangalore (IN); Nagarajan Viswanathan, Bangalore (IN); Visvesvaraya Pentakota, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/871,373

(22) Filed: Sep. 30, 2015

(30) Foreign Application Priority Data

Apr. 24, 2015 (IN) ............................ 2099/CHE/2015

(51) Int. Cl.
*H03M 1/12* (2006.01)
*H03M 1/06* (2006.01)
*H03M 1/00* (2006.01)
*H03M 1/36* (2006.01)

(52) U.S. Cl.
CPC ........... *H03M 1/0609* (2013.01); *H03M 1/002* (2013.01); *H03M 1/122* (2013.01); *H03M 1/361* (2013.01)

(58) Field of Classification Search
CPC .... H03M 1/06; H03M 1/1023; H03M 1/203; H03M 1/207; H03M 1/0609; H03M 1/002; H03M 1/122; H03M 1/361; H03M 3/458; H03M 1/12

USPC .................................................. 341/117–120
See application file for complete search history.

(56) References Cited

U.S. PATENT DOCUMENTS

| | | | |
|---|---|---|---|
| 2009/0131010 A1* | 5/2009 | Oshima ................. | H03M 1/122 455/334 |
| 2010/0164767 A1* | 7/2010 | Oshima ............... | H03M 1/1009 341/120 |
| 2011/0267211 A1* | 11/2011 | Oshima ............... | H03M 1/1038 341/118 |
| 2012/0075129 A1* | 3/2012 | Kidambi ............. | H03M 1/1052 341/118 |

* cited by examiner

*Primary Examiner* — Jean B Jeanglaude
(74) *Attorney, Agent, or Firm* — John R. Pessetto; Charles A. Brill; Frank D. Cimino

(57) ABSTRACT

In described examples, an analog to digital converter (ADC) includes a main ADC and a reference ADC. The main ADC generates a zone information signal and a digital output in response to an input signal. The reference ADC receives a plurality of reference voltages from the main ADC. The plurality of reference voltages includes a first reference voltage and a second reference voltage. The reference ADC generates a reference output in response to the input signal, the first reference voltage and the second reference voltage. A subtractor generates an error signal in response to the digital output and the reference output. A logic block generates one of a first offset correction signal, a second offset correction signal and a gain mismatch signal in response to the zone information signal, the error signal and the reference output.

20 Claims, 4 Drawing Sheets

US 9,479,186 B1

GAIN AND OFFSET CORRECTION IN AN INTERPOLATION ADC

CROSS REFERENCES TO RELATED APPLICATIONS

This application claims priority from India provisional patent application No. 2099/CHE/2015 filed on Apr. 24, 2015 which is hereby incorporated by reference in its entirety.

TECHNICAL FIELD

The present disclosure is generally related to analog to digital converters (ADCs), and more particularly to gain and offset estimation and correction in an interpolation ADC.

BACKGROUND

A flash analog to digital converter (ADC) has a highest conversion rate because of its fully parallel architecture. However, an N-bit flash ADC needs $2^N-1$ comparators, which consume large power and occupy large area. An interpolation ADC is an alternative approach to reduce the complexity of flash ADC and still maintain the high conversion rate. A number of amplifiers and a number of reference voltages required in the interpolation ADC is less than those required in the flash ADC. The interpolation ADC includes multiple amplifiers and a comparator block. Before the outputs of the multiple amplifiers are fed into the comparator block, an interpolation block is inserted. The interpolation block combines the outputs of multiple amplifiers and generates interpolated signals, which contains information of the amplifiers. After interpolation processing, the comparator block deals with more quantization levels.

Interpolation ADC is effective in digitization of high bandwidth signals. However, there are inherent drawbacks associated with the interpolation ADC. An offset associated with the amplifiers, and the gain mismatch among the amplifiers causes degradation in performance of the interpolation ADC. Although, an absolute gain of an amplifier of the multiple amplifiers is not critical, a mismatch in gain among the amplifiers should ideally be low. Designing the amplifiers to compensate for these drawbacks in not possible when the interpolation ADC is used for high speed operation.

SUMMARY

According to an aspect of the disclosure, an analog to digital converter (ADC) is disclosed. The ADC includes a main ADC and a reference ADC. The main ADC generates a zone information signal and a digital output in response to an input signal. The reference ADC receives a plurality of reference voltages from the main ADC. The plurality of reference voltages includes a first reference voltage and a second reference voltage. The reference ADC generates a reference output in response to the input signal, the first reference voltage and the second reference voltage. A subtractor generates an error signal in response to the digital output and the reference output. A logic block generates one of a first offset correction signal, a second offset correction signal and a gain mismatch signal in response to the zone information signal, the error signal and the reference output.

BRIEF DESCRIPTION OF THE VIEWS OF DRAWINGS

Figure 4A:
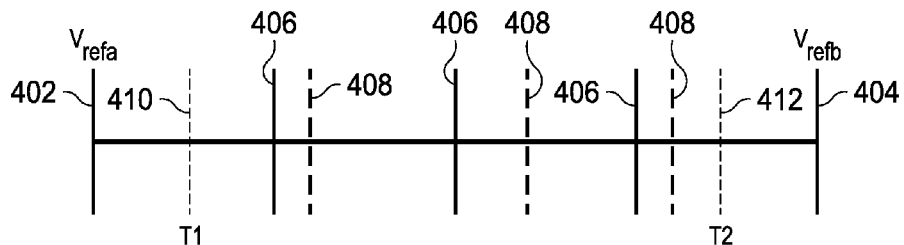
Figure 4B:
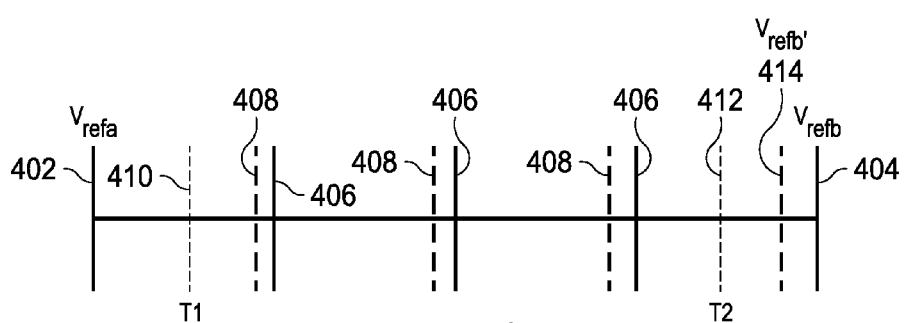
Figure 6:
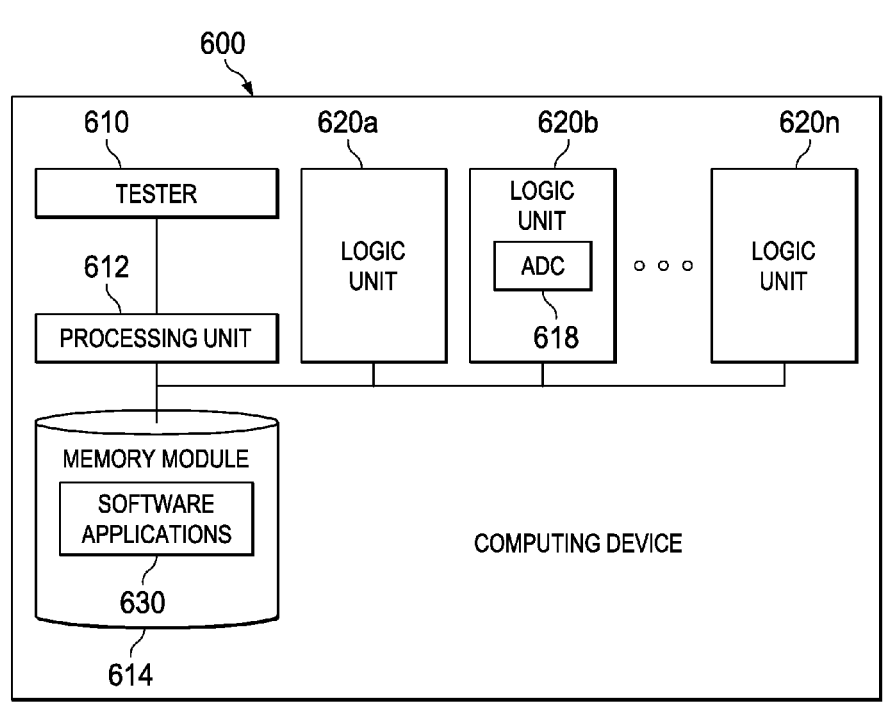
Figure 5:
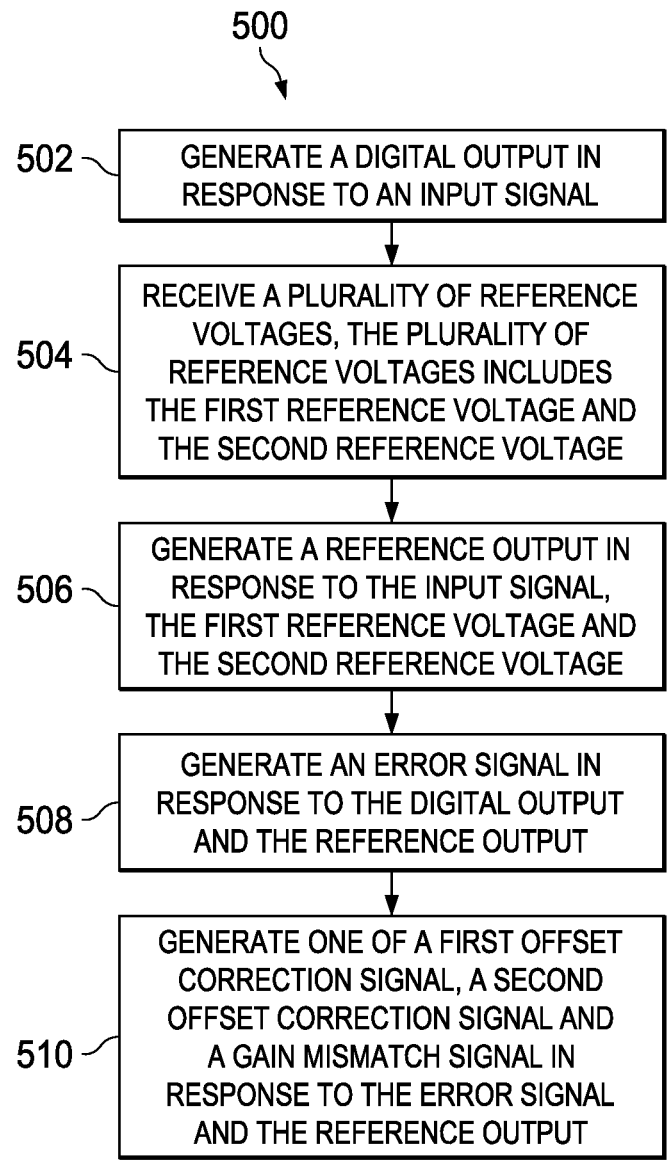

FIG. 4(a) and FIG. 4(b) illustrate operation of a logic block, according to an embodiment;

FIG. 5 is a flowchart to illustrate a method of operation of an analog to digital converter (ADC), according to an embodiment; and FIG. 6 illustrates a computing device, according to an embodiment.

DETAILED DESCRIPTION OF THE EMBODIMENTS

Figure 1:
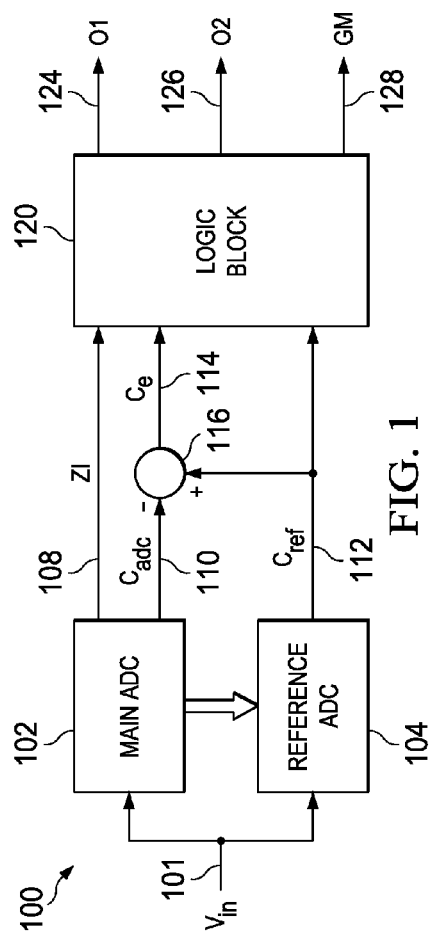
FIG. 1 illustrates an analog to digital converter (ADC), according to an embodiment.

FIG. 1 illustrates an analog to digital converter (ADC) 100, according to an embodiment. In one example, the ADC 100 is an interpolation ADC. The ADC 100 includes a main ADC 102, a reference ADC 104, a subtractor 116 and a logic block 120. The main ADC 102 and the reference ADC 104 receives an input signal Vin 101. The reference ADC 104 is coupled to the main ADC 102. The main ADC 102 includes multiple primary amplifiers. The subtractor 116 is coupled to the main ADC 102 and the reference ADC 104. The logic block 120 is coupled to the main ADC 102, the subtractor 116 and the reference ADC 104. The ADC 100 may include one or more additional components known to those skilled in the relevant art and are not discussed here for simplicity of the description.

The operation of the ADC 100 illustrated in FIG. 1 is explained now. The main ADC 102 generates a zone information signal ZI 108 and a digital output Cadc 110 in response to the input signal Vin 101. In one example, the main ADC 102 includes a reference voltage generator that generates a plurality of reference voltages. The reference ADC 104 receives the plurality of reference voltages from the main ADC 102. The reference ADC 104 selects a first reference voltage and a second reference voltage of the plurality of reference voltages. The reference ADC 104 generates a reference output Cref 112 in response to the input signal Vin 101, the first reference voltage and the second reference voltage.

The subtractor 116 generates an error signal Ce 114 on receiving the digital output Cadc 110 and the reference output Cref 112. The subtractor 116, in one version, subtracts the digital output Cadc 110 from the reference output Cref 112 to generate the error signal Ce 114. The logic block 120 receives the zone information signal ZI 108, the error signal Ce 114 and the reference output Cref 112. The logic block 120 generates one of a first offset correction signal O1 124, a second offset correction signal O2 126 and a gain mismatch signal GM 128 in response to the zone information signal ZI 108, the error signal CE 114 and the reference output Cref 112.

The logic block 120 uses the zone information signal ZI 108 to determine if the input signal Vin 101 is between the first reference voltage and the second reference voltage. When the input signal Vin 101 is between the first reference voltage and the second reference voltage, the logic block 120 is activated and generates one of the first offset correction signal O1 124, the second offset correction signal O2 126 and the gain mismatch signal GM 128. When the input signal Vin 101 is not in between the first reference voltage and the second reference voltage, the logic block 120 is inactivated and does not generate any of the first offset correction signal O1 124, the second offset correction signal O2 126 and the gain mismatch signal GM 128.

The logic block 120 generates one of the first offset correction signal O1 124, the second offset correction signal O2 126 and the gain mismatch signal GM 128 in different conditions which are now discussed. The logic block 120 generates the first offset correction signal O1 124 when the reference output Cref 112 is greater than a first threshold. A value of the first offset correction signal O1 124 is equal to the error signal Ce 114. The logic block 120 generates the second offset correction signal O2 126 when the reference output Cref 112 is less than a second threshold. A value of the second offset correction signal O2 126 is equal to the error signal Ce 114. The logic block 120 generates the gain mismatch signal GM 128 when the reference output Cref 112 is between the first threshold and the second threshold. A value of the gain mismatch signal GM 128 is proportional to the error signal Ce 114. Thus, a signal generated by the logic block 120 is proportional to the error signal Ce 114.

The logic block 120 provides one of the first offset correction signal O1 124, the second offset correction signal O2 126 and the gain mismatch signal GM 128 to the main ADC 102. Since, the logic block 120 is activated only when the input signal Vin 101 is between the first reference voltage and the second reference voltage of the plurality of reference voltages, therefore, the main ADC 102 uses a signal received from the logic block 120 for correction of an offset associated with the primary amplifiers receiving the reference voltages (first reference voltage and the second reference voltage) or for correction of gain mismatch between the primary amplifiers receiving the reference voltages.

The main ADC 102 corrects an offset associated with a primary amplifier receiving the first reference voltage on receiving the first offset correction signal O1 124. The main ADC 102 corrects an offset associated with a primary amplifier receiving the second reference voltage on receiving the second offset correction signal O2 126. The main ADC 102 corrects a gain mismatch between a primary amplifier receiving the first reference voltage and a primary amplifier receiving the second reference voltage on receiving the gain mismatch signal GM 128.

Thus, the ADC 100 provides a solution for efficient estimation and correction of the offset errors and gain mismatch errors. In one example, the reference ADC 104 is part of the main ADC 102. When the main ADC 102 is an interpolation ADC, a section of the main ADC 102 is used as the reference ADC 104. The offset and gain mismatch errors are estimated by using the digital output Cadc 110 and the reference output Cref 112.

Also, the ADC 100 provides a unique mechanism of determining if an error in the digital output Cadc 110 is because of offset error or gain mismatch error by using the reference output Cref 112. When the reference output Cref 112 is greater than the first threshold or when the reference output Cref 112 is less than the second threshold, the error in the digital output Cadc 110 is because of offset associated with the primary amplifiers receiving the reference voltages (first reference voltage and the second reference voltage). When the reference output Cref 112 is between the first threshold and the second threshold, the error in the digital output Cadc 110 is because of the gain mismatch error between the primary amplifiers.

Figure 2:
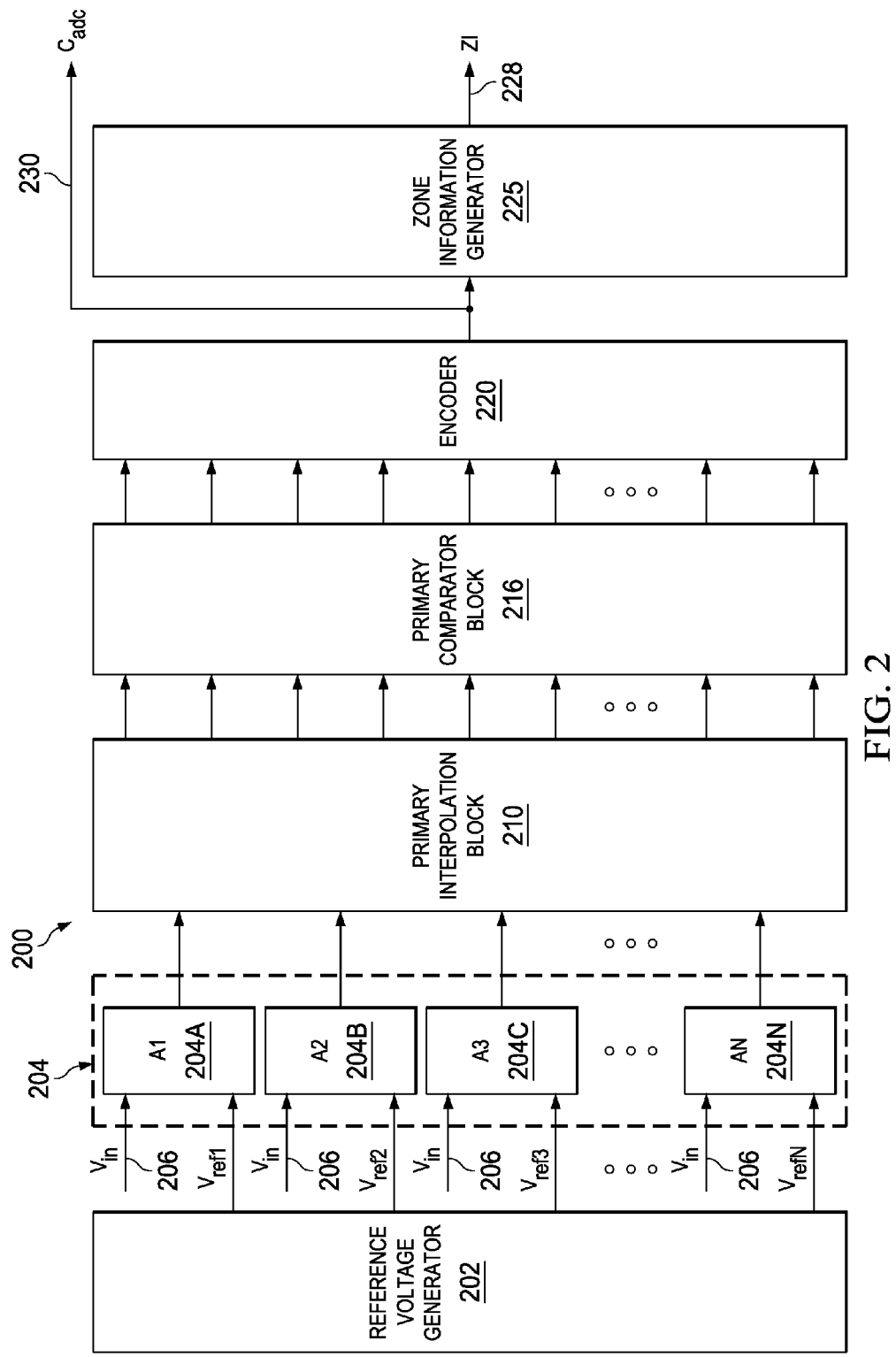
FIG. 2 illustrates a main ADC, according to an embodiment.

FIG. 2 illustrates a main ADC 200, according to an embodiment. The main ADC 200 is similar in connection and operation to the main ADC 102 illustrated in FIG. 1. The main ADC 200 includes a reference voltage generator 202, a plurality of primary amplifiers 204, a primary interpolation block 210, a primary comparator block 216, an encoder 220 and a zone information generator 225. The plurality of primary amplifiers 204 includes multiple primary amplifiers illustrated as A1 204A, A2 204B to AN 204N. The primary interpolation block 210 is coupled to the plurality of primary amplifiers 204. The primary comparator block 216 is coupled to the primary interpolation block 210, and the encoder 220 is coupled to the primary comparator block 216. The zone information generator 225 is coupled to the encoder 220. The main ADC 200 may include one or more additional components known to those skilled in the relevant art and are not discussed here for simplicity of the description.

The operation of the main ADC 200 illustrated in FIG. 2 is explained now. The reference voltage generator 202 generates a plurality of reference voltages illustrated as Vref1, Vref2 to VrefN. Each primary amplifier of the plurality of primary amplifiers 204 receives an input signal Vin 206. The input signal Vin 206 is similar to the input signal Vin 101 received by the main ADC 102 in FIG. 1. The plurality of primary amplifiers 204 generates a plurality of primary variance signals in response to the input signal Vin 206 and the plurality of reference voltages illustrated as Vref1, Vref2 to VrefN. In one example, each primary amplifier compares the input signal Vin 206 and a reference voltage of the plurality of reference voltages to generate a primary variance signal of the plurality of variance signals. For example, the primary amplifier A1 204A compares the input signal Vin 206 and the reference voltage Vref1, and generates a primary variance signal. Similarly, the primary amplifier AN 204N compares the input signal Vin 206 and the reference voltage VrefN, and generates a primary variance signal.

The primary interpolation block 210 receives the plurality of primary variance signals from the plurality of primary amplifiers 204. The primary interpolation block 210 interpolates the plurality of primary variance signals based on an interpolation factor, and generates a plurality of primary interpolated signals. The interpolation factor is associated with the primary interpolation block 210. In one version, the primary interpolation block 210 interpolates primary variance signals from two consecutive primary amplifiers to generate a set of primary interpolated signals of the plurality of primary interpolated signals.

For example, the primary interpolation block 210 interpolates primary variance signals from the primary amplifier A1 204A and the primary amplifier A2 204B to generate a set of primary interpolated signals. Similarly, the primary interpolation block 210 interpolates primary variance signals from the primary amplifier A2 204B and the primary amplifier A3 204C to generate a set of primary interpolated signals.

The primary comparator block 216 generates a plurality of primary digital bits in response to the plurality of primary interpolated signals received from the primary interpolation block 210. The primary comparator block 216 compares each primary interpolated signal with a defined primary value to generate a primary digital bit of the plurality of primary digital bits. In one example, the primary comparator block 216 includes plurality of comparators. Each comparator of the plurality of comparators compares a primary interpolated signal with the defined primary value to generate the primary digital bit. In another example, each comparator compares if the primary interpolated signal is above or below the defined primary value and then generates a 1 or 0 respectively. The defined primary value in one version is zero. In another version, the defined primary value is fixed by a manufacturer before sampling a product with the main ADC 200.

The encoder 220 receives the plurality of primary digital bits and encodes these bits to generate a digital output Cadc 230. The digital output Cadc 230 is similar to the digital output Cadc 110 illustrated in FIG. 1. In one example, the encoder 220 is a thermometric to binary code converter that receives the plurality of primary digital bits and generates a corresponding thermometric code. The zone information generator 225 receives the digital output Cadc 230 and generates a zone information signal ZI 228 based on the interpolation factor of the primary interpolation block 210. The zone information signal ZI 228 is similar to the zone information signal ZI 108 generated by the main ADC 102 in FIG. 1. The zone information signal ZI 228 provides information on the reference voltages between which the digital output Cadc 230 lies. For example, the zone information signal ZI 228 provides information that the digital output Cadc 230 is between the reference voltages Vref1 and Vref2.

Figure 3:
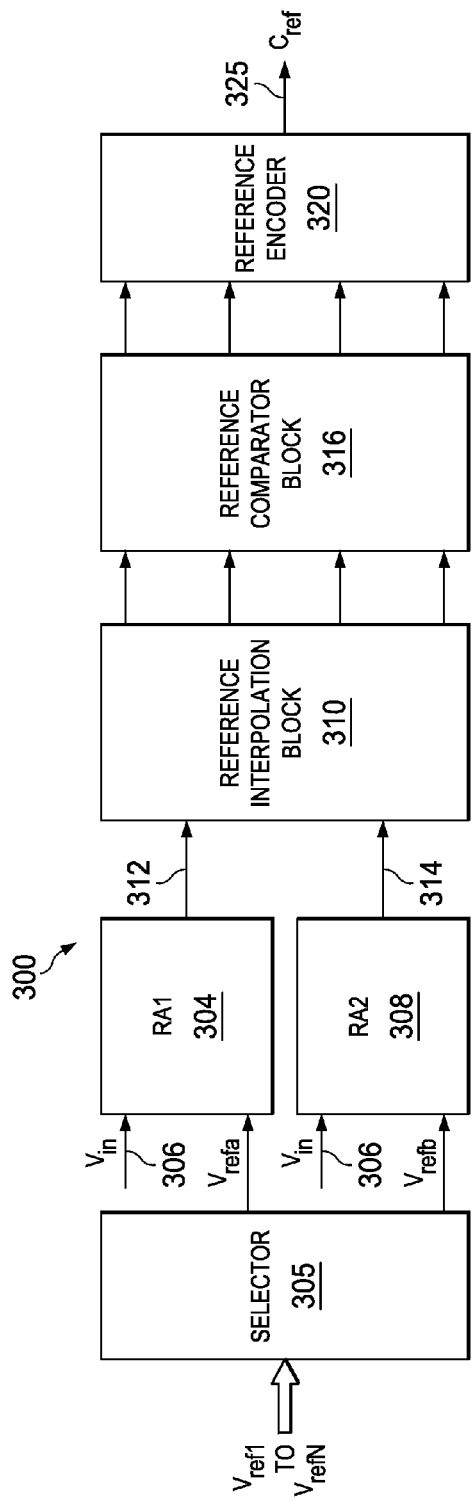
FIG. 3 illustrates a reference ADC, according to an embodiment.

FIG. 3 illustrates a reference ADC 300, according to an embodiment. The reference ADC 300 is similar in connection and operation to the reference ADC 104 illustrated in FIG. 1. The reference ADC 300 includes a selector 305, a first reference amplifier RA1 304, a second reference amplifier RA2 308, a reference interpolation block 310, a reference comparator block 316, and a reference encoder 320. The first amplifier RA1 304 and the second amplifier RA2 308 are coupled to the selector 305. The reference interpolation block 310 is coupled to the first amplifier RA1 304 and the second amplifier RA2 308. The reference comparator block 316 is coupled to the reference interpolation block 310, and the reference encoder 320 is coupled to the reference comparator block 316. The reference ADC 300 may include one or more additional components known to those skilled in the relevant art and are not discussed here for simplicity of the description.

The operation of the reference ADC 300 illustrated in FIG. 3 is explained now. The selector 305 receives a plurality of reference voltages Vref 1 to Vref N. The reference ADC 300 in one example, receives the plurality of reference voltages from the main ADC similar to the main ADC 200 illustrated in FIG. 2. As illustrated in the FIG. 2, the reference voltage generator 202 generates a plurality of reference voltages illustrated as Vref1, Vref2. Vref3 to VrefN. The selector 305 selects a first reference voltage Vrefa and a second reference voltage Vrefb from the plurality of reference voltages Vref 1 to Vref N. In one example, the first reference voltage Vrefa and the second reference voltage Vrefb are consecutive reference voltages in the plurality of reference voltages. In another example, the first reference voltage Vrefa is less than the second reference voltage Vrefb.

In yet another example, the selector 305 selects the reference voltages in serial order in each cycle. For example, the selector 305 receives the reference voltages Vref1, Vref2, Vref3 and Vref4. In a first cycle, the selector 305 selects the reference voltage Vref1 and Vref2. Thus, Vref1 is the first reference voltage Vrefa and Vref2 is the second reference voltage Vrefb. In a second cycle, the selector 305 selects the reference voltage Vref2 and Vref3. Thus, Vref2 is the first reference voltage Vrefa and Vref3 is the second reference voltage Vrefb.

Each of the first reference amplifier RA1 304 and the second reference amplifier RA2 308 receives an input signal Vin 306. The input signal Vin 306 is similar to the input signal Vin 101 received by the reference ADC 104 in FIG. 1. The first reference amplifier RA1 304 compares the input signal Vin 306 and the first reference voltage Vrefa to generate a first variance signal 312. The second reference amplifier RA2 308 compares the input signal Vin 306 and the second reference voltage Vrefb to generate a second variance signal 314.

The reference interpolation block 310 interpolates the first variance signal 312 and the second variance signal 314 using a reference interpolation factor. The reference interpolation block generates a plurality of secondary interpolated signals. The reference interpolation factor is associated with the reference interpolation block 310. The reference comparator block 316 generates a plurality of secondary digital bits in response to the plurality of secondary interpolated signals received from the reference interpolation block 310.

The reference comparator block 316 compares each secondary interpolated signal with a defined secondary value to generate a secondary digital bit of the plurality of secondary digital bits. In one example, the reference comparator block 316 includes plurality of comparators. Each comparator of the plurality of comparators compares a secondary interpolated signal with the defined secondary value to generate the secondary digital bit. In another example, each comparator compares if the secondary interpolated signal is above or below the defined secondary value and then generates a 1 or 0 respectively. The defined secondary value in one version is zero. In another version, the defined secondary value is fixed by a manufacturer before sampling a product with the reference ADC 300.

The reference encoder 320 receives the plurality of secondary digital bits and encodes these bits to generate a reference output Cref 325. The reference output Cref 325 is similar to the reference output Cref 112 illustrated in FIG. 1. In one example, the reference encoder 320 is a thermometric to binary code converter that receives the plurality of secondary digital bits and generates a corresponding thermometric code.

The operation of the logic block 120 is now explained in connection with the main ADC 200 (illustrated in FIG. 2) and the reference ADC 300 (illustrated in FIG. 3). The logic block 120 uses the zone information signal ZI 228 to determine if the input signal Vin 306 is between the first reference voltage Vrefa and the second reference voltage Vrefb. When the input signal Vin 306 is between the first reference voltage Vrefa and the second reference voltage Vrefb, the logic block 120 is activated. If the input signal Vin 306 is not between the first reference voltage Vrefa and the second reference voltage Vrefb, the logic block 120 is not activated. In the next cycle, the selector 305 selects a different set of reference voltages, and the logic block 120 again determines if the input signal Vin 306 is between the reference voltages selected by the selector 305. If the input signal Vin 306 is between the reference voltages selected by the selector 305, the logic block 120 is activated and generates one of the first offset correction signal O1 124, the second offset correction signal O2 126 and the gain mismatch signal GM 128.

FIG. 4(a) and FIG. 4(b) illustrate operation of a logic block, according to an embodiment. The FIGS. 4(a) and 4(b) are explained in connection with the logic block 120 illustrated in FIG. 1. The main ADC 102 includes multiple primary amplifiers. A section includes a first reference voltage Vrefa 402 and a second reference voltage Vrefb 404, and they have multiple interpolated thresholds between them. The lines represented as 406 are ideal interpolated thresholds whereas the dotted lines represented as 408 are actual interpolated thresholds. The actual interpolated thresholds are obtained because of non-idealities in the ADC 100. The major reasons are a gain mismatch between primary amplifiers receiving the reference voltages and an offsets associated with the primary amplifiers receiving the reference voltages.

FIG. 4(*b*) illustrates when the ADC 100 has offsets associated with the primary amplifiers in the main ADC. When an offset is associated with at least one of the primary amplifier that receives the first reference voltage Vrefa 402 and the second reference voltage Vrefb 404, it affects end points of the section. Thus, in the illustrated FIG. 4(*b*), the second reference voltage Vrefb 404 shifts to Vrefb' 414. This causes all the interpolated thresholds to shift. This indicates that the error in the ADC 100 is because of offsets associated with the primary amplifiers that receive the reference voltages. When the reference output Cref 112 is greater than a first threshold T1 410, the logic block 120 generates the first offset correction signal O1 124. The main ADC 102 receives the first offset correction signal O1 124 from the logic block 120 and corrects an offset associated with the primary amplifier receiving the first reference voltage Vrefa 402.

When the reference output Cref 112 is less than a second threshold T2 412, the logic block 120 generates the second offset correction signal O2 126. The main ADC 102 receives the second offset correction signal from the logic block 120 and corrects an offset associated with the primary amplifier receiving the second reference voltage Vrefb 404.

FIG. 4(*a*) illustrates when the ADC 100 has gain mismatch between successive primary amplifiers in the main ADC, for example A1 204A and A2 204B are successive primary amplifiers in the main ADC 200. When gain mismatch occurs, it affects the interpolated thresholds between the first reference voltage Vrefa 402 and the second reference voltage Vrefb 404. Thus, a difference between the ideal interpolated thresholds and actual interpolated thresholds varies more in the middle of the first reference voltage Vrefa 402 and the second reference voltage Vrefb 404. When the reference output Cref 112 is between the first threshold T1 410 and the second threshold T2 412, the logic block 120 generates the gain mismatch signal GM 128. The main ADC 102 receives the gain mismatch signal GM 128 from the logic block 120 and corrects a gain mismatch between the primary amplifier that receives the first reference voltage Vrefa 402 and the primary amplifier that receives the second reference voltage Vrefb 404.

Each of the first offset correction signal O1 124, and the second offset correction signal O2 126 are equal to a difference between the digital output Cadc 110 and the reference output Cref 112. The gain mismatch signal GM 128 is proportional to the difference between the digital output Cadc 110 and the reference output Cref 112. Thus, with the use of logic block 120 the ADC 100 is able to estimate and correct offset error or gain mismatch error.

FIG. 5 is a flowchart 500 to illustrate a method of operation of an analog to digital converter (ADC), according to an embodiment. The flowchart 500 is explained in connection with the ADC 100. At step 502, a digital output is generated in response to an input signal. For example, in ADC 100, the digital output Cadc 110 is generated in response to the input signal Vin 101. At step 504, a plurality of reference voltages is received. The plurality of reference voltages includes the first reference voltage and the second reference voltage.

At step 506, a reference output is generated in response to the input signal, the first reference voltage and the second reference voltage. For example, in ADC 100, a reference output Cref 112 is generated in response to the input signal Vin 101, the first reference voltage and the second reference voltage. An error signal is generated in response to the digital output and the reference output, at step 508. In one version, the digital output is subtracted from the reference output to generate the error signal.

At step 510, one of a first offset correction signal, a second offset correction signal and a gain mismatch signal is generated in response to the error signal and the reference output. In ADC 100, one of the first offset correction signal, the second offset correction signal and the gain mismatch signal is generated when the input signal is between the first reference voltage and the second reference voltage. When the input signal is not in between the first reference voltage and the second reference voltage, the logic block does not generate any of the first offset correction signal, the second offset correction signal and the gain mismatch signal.

In ADC 100, the logic block 120 generates the first offset correction signal when the reference output is greater than a first threshold. A value of the first offset correction signal is equal to the error signal. The logic block 120 generates the second offset correction signal when the reference output is less than a second threshold. A value of the second offset correction signal is equal to the error signal. The logic block 120 generates the gain mismatch signal when the reference output is between the first threshold and the second threshold. A value of the gain mismatch signal is proportional to the error signal. Thus, a signal generated by the logic block 120 is proportional to the error signal.

An offset associated with a primary amplifier that receives the first reference voltage is corrected when first offset correction signal is generated. An offset associated with a primary amplifier that receives the second reference voltage is corrected when the second offset correction signal is generated. A gain mismatch between two successive primary amplifiers receiving the first reference voltage and the second reference voltage is corrected on receiving the gain mismatch signal.

FIG. 6 illustrates a computing device 600, according to an embodiment. The computing device 600 is, or is incorporated into, a mobile communication device, such as a mobile phone, a personal digital assistant, a transceiver, a personal computer, or any other type of electronic system. The computing device 600 may include one or more additional components known to those skilled in the relevant art and are not discussed here for simplicity of the description.

In some embodiments, the computing device 600 comprises a megacell or a system-on-chip (SoC) which includes a processing unit 612 such as a CPU (Central Processing Unit), a memory module 614 (e.g., random access memory (RAM)) and a tester 610. The processing unit 612 can be, for example, a CISC-type (Complex Instruction Set Computer) CPU, RISC-type CPU (Reduced Instruction Set Computer), or a digital signal processor (DSP).

The memory module 614 (which can be memory such as RAM, flash memory, or disk storage) stores one or more software applications 630 (e.g., embedded applications) that, when executed by the processing unit 612, performs any suitable function associated with the computing device 600. The tester 610 comprises logic that supports testing and debugging of the computing device 600 executing the software applications 630.

For example, the tester 610 can be used to emulate a defective or unavailable component(s) of the computing device 600 to allow verification of how the component(s), were it actually present on the computing device 600, would perform in various situations (e.g., how the component(s)

would interact with the software applications 630). In this way, the software applications 630 can be debugged in an environment which resembles post-production operation.

The processing unit 612 typically comprises memory and logic which store information frequently accessed from the memory module 614. The computing device 600 includes a plurality of logic units illustrated as 620a, 620b to 620n. The plurality of logic units are coupled to the processing unit 612 and the memory module 614. A logic unit can be, for example, one of the following, but not limited to, a transmitter, a receiver, and a delta sigma modulator. At least one logic unit of the plurality of logic units includes an analog to digital converter (ADC) 618. The ADC 618 is similar in connection and operation to the ADC 100. The ADC 618 includes a main ADC, a reference ADC, a subtractor and a logic block.

The main ADC generates a zone information signal and a digital output in response to the input signal. The reference ADC receives the plurality of reference voltages from the main ADC. The reference ADC selects a first reference voltage and a second reference voltage of the plurality of reference voltages. The reference ADC generates a reference output in response to the input signal, the first reference voltage and the second reference voltage. The subtractor generates an error signal on receiving the digital output and the reference output. The logic block generates one of a first offset correction signal, a second offset correction signal and a gain mismatch signal in response to the zone information signal, the error signal and the reference output.

The ADC 618 provides a solution for efficient estimation and correction of the offset errors and gain mismatch errors. The offset and gain mismatch errors are estimated by using the digital output and the reference output. The ADC 618 provides a unique mechanism of determining if an error in the digital output is because of offset error or gain mismatch error by using the reference output. When the reference output is greater than the first threshold or when the reference output is less than the second threshold, the error in the digital output is because of offset associated with the reference voltages (first reference voltage and the second reference voltage). When the reference output is between the first threshold and the second threshold, the error in the digital output is because of the gain mismatch error.

The foregoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of above teachings, and it is thus intended that the scope of invention not be limited by this Detailed Description, but only by the following Claims.

What is claimed is:

1. An analog to digital converter (ADC) comprising:
   a main ADC configured to generate a zone information signal and a digital output in response to an input signal;
   a reference ADC configured to receive a plurality of reference voltages from the main ADC, the plurality of reference voltages includes a first reference voltage and a second reference voltage, and the reference ADC configured to generate a reference output in response to the input signal, the first reference voltage and the second reference voltage;
   a subtractor configured to generate an error signal in response to the digital output and the reference output; and
   a logic block coupled to the main ADC, the reference ADC and the subtractor, the logic block configured to generate one of a first offset correction signal, a second offset correction signal and a gain mismatch signal in response to the zone information signal, the error signal and the reference output.

2. The ADC of claim 1, wherein the logic block is configured to use the zone information signal to determine if the input signal is between the first reference voltage and the second reference voltage, and wherein the logic block is activated when the input signal is between the first reference voltage and the second reference voltage.

3. The ADC of claim 1, wherein the logic block is configured to generate:
   the first offset correction signal when the reference output is greater than a first threshold, a value of the first offset correction signal is equal to the error signal;
   the second offset correction signal when the reference output is less than a second threshold, a value of the second offset correction signal is equal to the error signal; and
   the gain mismatch signal when the reference output is between the first threshold and the second threshold, a value of the gain mismatch signal is proportional to the error signal.

4. The ADC of claim 1, wherein the logic block is configured to provide one of the first offset correction signal, the second offset correction signal and the gain mismatch signal to the main ADC.

5. The ADC of claim 1, wherein the main ADC comprises:
   a reference voltage generator configured to generate the plurality of reference voltages;
   a plurality of primary amplifiers configured to generate a plurality of primary variance signals in response to the input signal and the plurality of reference voltages;
   a primary interpolation block coupled to the plurality of primary amplifiers, and configured to generate a plurality of primary interpolated signals in response to the plurality of primary variance signals and an interpolation factor of the primary interpolation block;
   a primary comparator block coupled to the primary interpolation block, and configured to generate a plurality of primary digital bits in response to the plurality of primary interpolated signals; and
   an encoder coupled to the primary comparator block, and configured to generate the digital output in response to the plurality of primary digital bits.

6. The ADC of claim 5, wherein the main ADC is configured to:
   correct an offset associated with a primary amplifier that receives the first reference voltage, on receiving the first offset correction signal;
   correct an offset associated with a primary amplifier that receives the second reference voltage, on receiving the second offset correction signal; and
   correct a gain mismatch between a primary amplifier that receives the first reference voltage and a primary amplifier that receives the second reference voltage, on receiving the gain mismatch signal.

7. The ADC of claim 5, wherein the main ADC further comprises a zone information generator configured to generate the zone information signal in response to the digital output and the interpolation factor of the primary interpolation block.

8. The ADC of claim 5, wherein each primary amplifier of the plurality of primary amplifiers is configured to compare the input signal and a reference voltage of the plurality of reference voltages to generate a primary variance signal of the plurality of primary variance signals.

9. The ADC of claim 5, wherein the primary interpolation block is configured to interpolate primary variance signals from two consecutive primary amplifiers of the plurality of primary amplifiers to generate a set of primary interpolated signals of the plurality of primary interpolated signals.

10. The ADC of claim 5, wherein the primary comparator block is configured to compare each primary interpolated signal of the plurality of primary interpolated signals with a defined primary value to generate a primary digital bit of the plurality of primary digital bits.

11. The ADC of claim 1, wherein the reference ADC comprises:
   a selector coupled to the reference voltage generator, and configured to select the first reference voltage and the second reference voltage from the plurality of reference voltages, the first reference voltage is less than the second reference voltage;
   a first reference amplifier configured to compare the input signal and the first reference voltage to generate a first variance signal;
   a second reference amplifier configured to compare the input signal and the second reference voltage to generate a second variance signal;
   a reference interpolation block configured to interpolate the first variance signal and the second variance signal using a reference interpolation factor to generate a plurality of secondary interpolated signals;
   a reference comparator block coupled to the reference interpolation block, and configured to generate a plurality of secondary digital bits in response to the plurality of secondary interpolated signals; and
   a reference encoder coupled to the reference comparator block, and configured to generate the reference output in response to the plurality of secondary digital bits.

12. The ADC of claim 11, wherein the reference comparator block is configured to compare each secondary interpolated signal of the plurality of secondary interpolated signals with a defined secondary value to generate a secondary digital bit of the plurality of secondary digital bits.

13. A method comprising:
   generating a digital output in response to an input signal;
   receiving a plurality of reference voltages, the plurality of reference voltages includes a first reference voltage and a second reference voltage;
   generating a reference output in response to the input signal, the first reference voltage and the second reference voltage;
   generating an error signal in response to the digital output and the reference output; and
   generating one of a first offset correction signal, a second offset correction signal and a gain mismatch signal in response to the error signal and the reference output.

14. The method of claim 13, wherein generating one of the first offset correction signal, the second offset correction signal and the gain mismatch signal when the input signal is between the first reference voltage and the second reference voltage.

15. The method of claim 13 further comprising:
   generating the first offset correction signal when the reference output is greater than a first threshold, a value of the first offset correction signal is equal to the error signal;
   generating the second offset correction signal when the reference output is less than a second threshold, a value of the second offset correction signal is equal to the error signal; and
   generating the gain mismatch signal when the reference output is between the first threshold and the second threshold, a value of the gain mismatch signal is proportional to the error signal.

16. The method of claim 13 further comprising:
   correcting an offset associated with a primary amplifier that receives the first reference voltage, when the first offset correction signal is generated;
   correcting an offset associated with a primary amplifier that receives the second reference voltage, when the second offset correction signal is generated; and
   correcting a gain mismatch between a primary amplifier that receives the first reference voltage and a primary amplifier that receives the second reference voltage, when the gain mismatch signal is generated.

17. The method of claim 13, wherein generating the digital output further comprises:
   generating the plurality of reference voltages;
   generating a plurality of primary variance signals in response the input signal and the plurality of reference voltages;
   generating a plurality of primary interpolated signals in response to the plurality of primary variance signals;
   generating a plurality of primary digital bits in response to the plurality of primary interpolated signals; and
   encoding the plurality of primary digital bits.

18. The method of claim 17 further comprising comparing each primary interpolated signal of the plurality of primary interpolated signals with a defined primary value to generate a primary digital bit of the plurality of primary digital bits.

19. The method of claim 13, wherein generating the reference output further comprises:
   selecting the first reference voltage and the second reference voltage from the plurality of reference voltages;
   comparing the input signal and the first reference voltage to generate a first variance signal;
   comparing the input signal and the second reference voltage to generate a second variance signal;
   interpolating the first variance signal and the second variance signal to generate a plurality of secondary interpolated signals;
   generating a plurality of secondary digital bits in response to the plurality of secondary interpolated signals; and
   encoding the plurality of secondary digital bits.

20. A computing device comprising:
   a processing unit;
   a memory module coupled to the processing unit; and
   a plurality of logic units coupled to the processing unit and the memory module, at least one logic unit of the plurality of logic units comprising an ADC, the ADC comprising:
      a main ADC configured to generate a zone information signal and a digital output in response to an input signal;
      a reference ADC configured receive a plurality of reference voltages from the main ADC, the plurality of reference voltages includes a first reference voltage and a second reference voltage, and the reference ADC configured to generate a reference output in response to the input signal, the first reference voltage and the second reference voltage;

a subtractor configured to generate an error signal in response to the digital output and the reference output; and a logic block coupled to the main ADC, the reference ADC and the subtractor, the logic block configured to generate one of a first offset correction signal, a second offset correction signal and a gain mismatch signal in response to the zone information signal, the error signal and the reference output.

* * * * *